US006750116B1

United States Patent
Chen

(10) Patent No.: US 6,750,116 B1
(45) Date of Patent: Jun. 15, 2004

(54) METHOD FOR FABRICATING ASYMMETRIC INNER STRUCTURE IN CONTACTS OR TRENCHES

(75) Inventor: Yinan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/604,341

(22) Filed: Jul. 14, 2003

(51) Int. Cl.[7] .............................................. H01L 21/76
(52) U.S. Cl. ....................... 438/434; 438/422; 438/243; 438/396; 438/219
(58) Field of Search ................................ 438/218–222, 438/424–438, 243–249, 386–392

(56) References Cited

U.S. PATENT DOCUMENTS

| | | | | |
|---|---|---|---|---|
| 5,240,875 | A | * | 8/1993 | Tsou ........................... 438/696 |
| 6,323,106 | B1 | * | 11/2001 | Huang et al. ................ 438/433 |
| 6,426,253 | B1 | * | 7/2002 | Tews et al. .................. 438/243 |
| 6,426,526 | B1 | * | 7/2002 | Divakaruni et al. ......... 257/302 |
| 6,498,061 | B2 | * | 12/2002 | Divakaruni et al. ......... 438/243 |
| 6,518,118 | B2 | * | 2/2003 | Athavale et al. ............. 438/243 |
| 6,521,493 | B1 | * | 2/2003 | Alsmeier et al. ............ 438/199 |
| 6,541,350 | B2 | * | 4/2003 | Chen ........................... 438/424 |
| 6,573,137 | B1 | * | 6/2003 | Divakaruni et al. ......... 438/248 |
| 6,593,612 | B2 | * | 7/2003 | Gruening et al. ............ 257/301 |
| 6,649,928 | B2 | * | 11/2003 | Dennison ........................ 257/4 |
| 2002/0121704 | A1 | * | 9/2002 | Lowrey et al. .............. 257/774 |

FOREIGN PATENT DOCUMENTS

JP 04061346 A * 2/1992 .......... H01L/21/331

* cited by examiner

Primary Examiner—John F. Niebling
Assistant Examiner—Jennifer M. Kennedy
(74) Attorney, Agent, or Firm—Winston Hsu

(57) ABSTRACT

The present invention provides a method for making an asymmetric inner structure in a contact or trench having a first sidewall, second sidewall, and a bottom in a semiconductor layer. A conformal dielectric layer is deposited on the interior surface of the contact or trench covering the first sidewall, second sidewall, and the bottom. A title angle ion implantation process is carried out to implant ions into the dielectric layer on the first sidewall and the bottom, but not the dielectric layer on the second sidewall. Thereafter, the doped dielectric layer on the first sidewall and the bottom is selectively etched away and leaving the un-doped dielectric layer on the second sidewall intact.

6 Claims, 15 Drawing Sheets

METHOD FOR FABRICATING ASYMMETRIC INNER STRUCTURE IN CONTACTS OR TRENCHES

BACKGROUND OF INVENTION

1. Field of the Invention

The present invention relates to a semiconductor fabrication processes. More particularly, the present invention relates to a method for fabricating asymmetric inner structure in contacts or trenches.

2. Description of the Prior Art

In the fabrication of semiconductor devices, trenches, via or contact holes are always needed to provide electrical paths for devices situated in different levels of an integrated circuit chip or for isolation purposes. For example, shallow trenches are formed in the substrate in the front-end process. Dielectric materials are then deposited to fill the trenches such that the devices are isolated with the trenches. This is also known in the art as shallow trench isolation (STI) process. Via or contact holes are typically formed in interlayer dielectric films as parts of the interconnections.

Sometimes, the trenches or via/contact holes with an asymmetric inner structure on their bottom and sidewalls are needed. However, the prior art method for making such asymmetric structure in the trenches or via/contact holes is complex and not reliable. According to the prior art method, to form such asymmetric structure in the trenches or via/contact holes, a photoresist layer is coated on the substrate to mask a part of the trench or contact opening, then a thermal or etching process is carried out, followed by removal of the photoresist. The process window of the prior art photolithographic method is quite small for contact holes with a small critical dimension, and misalignment happens from time to time.

SUMMARY OF INVENTION

Accordingly, the primary object of the present invention is to provide a semiconductor fabrication process for making asymmetric structure in trenches or contact holes without the need of using photoresist or lithographic process.

According to the claimed invention, a method for making an asymmetric interior structure in a trench or contact hole of a substrate layer is provided. At least one trench or contact hole is formed in a substrate layer. The trench or contact opening comprises a first sidewall, second sidewall, and a bottom. A first dielectric layer is formed on the first sidewall, the second sidewall, and the bottom. A title angle ion implantation process is then carried out to dope ions into the first dielectric layer on the first sidewall and on the bottom, but not dope ions into the first dielectric layer on the second sidewall, thereby resulting in etching selectivity between the doped first dielectric layer on the first sidewall and on the bottom, and the non-doped first dielectric layer on the second sidewall. The doped first dielectric layer on the first sidewall and on the bottom is selectively etching away, thereby forming an asymmetric interior structure in the trench or contact hole.

Other objects, advantages, and novel features of the claimed invention will become more clearly and readily apparent from the following detailed description when taken in conjunction with the accompanying drawings.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings

FIG. 10 to FIG. 12 are schematic cross-sectional diagrams illustrating the preferred embodiment of making the structure III according to the present invention, wherein the cross section as set forth in FIG. 10 is the structure I.

DETAILED DESCRIPTION

Figure 1:
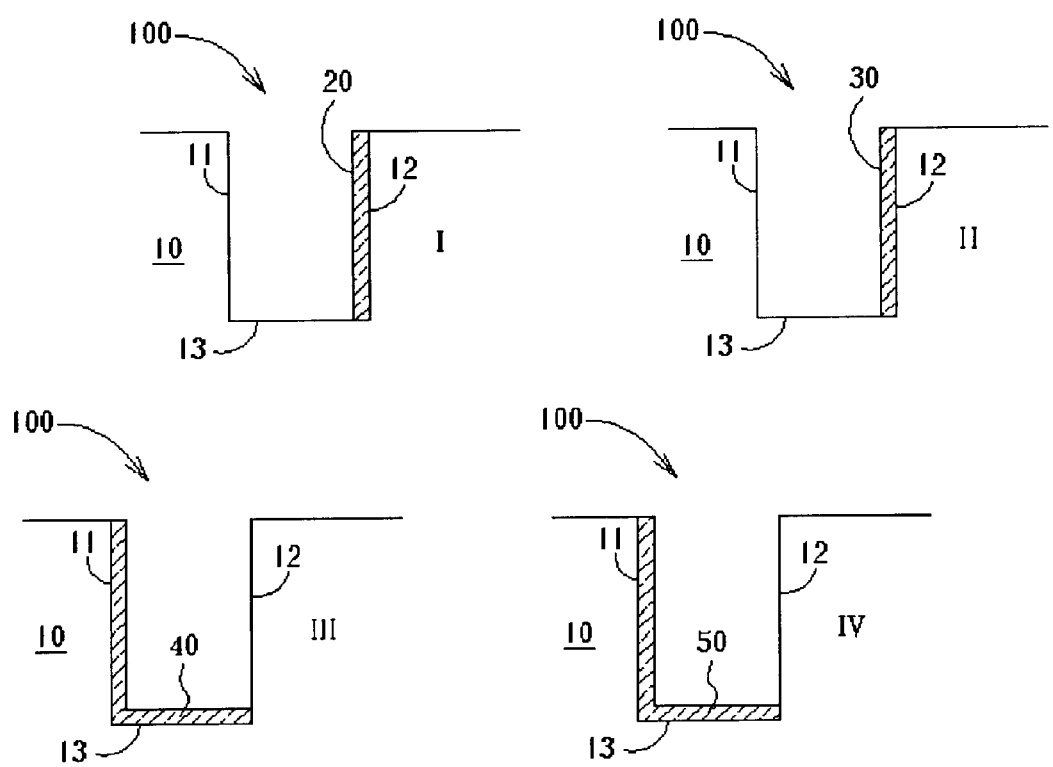
FIG. 1 depicts four trench or via/contact holestructures (structures I, II, III, and IV) with an asymmetric interior in accordance with the preferred embodiments of the present invention.

Please refer to FIG. 1. FIG. 1 depicts four trench or via/contact holestructures (structures I, II, III, and IV) with an asymmetric interior in accordance with the preferred embodiments of the present invention. As shown in FIG. 1, the structure I comprises a substrate layer 10 having a trench 100 therein. The substrate layer 10 may be a semiconductor substrate or silicon substrate, but not limited thereto. The trench 100 has a bottom 13 and sidewalls 11 and 12. A silicon dioxide layer 20 is formed on the sidewall 12. The sidewall 11 and the bottom 13 are bare silicon surfaces. The structure II comprises a substrate layer 10 with a trench 100 thereon. Likewise, the trench 100 has a bottom 13 and sidewalls 11 and 12. An RTN (rapid thermal nitridation) silicon nitride layer 40 is formed on the sidewall 12. The sidewall 11 and the bottom 13 are bare silicon surfaces. The structure III comprises an RTN silicon nitride layer 40 lying on the sidewall 11 and the bottom 13 of the trench 100, but not on the sidewall 12, thereby forming an asymmetric interior structure. The structure IV comprises an RTO (rapid thermal oxidation) silicon oxide layer 50 on the sidewall 11 and the bottom 13, but not on the sidewall 12.

The method for making the above-described four trench or via/contact holestructures (structures I, II, III, and IV) with asymmetric interiors in accordance with the preferred embodiments of the present invention will now be discussed in detail through FIG. 2 to FIG. 15.

Structure I

Figure 2:
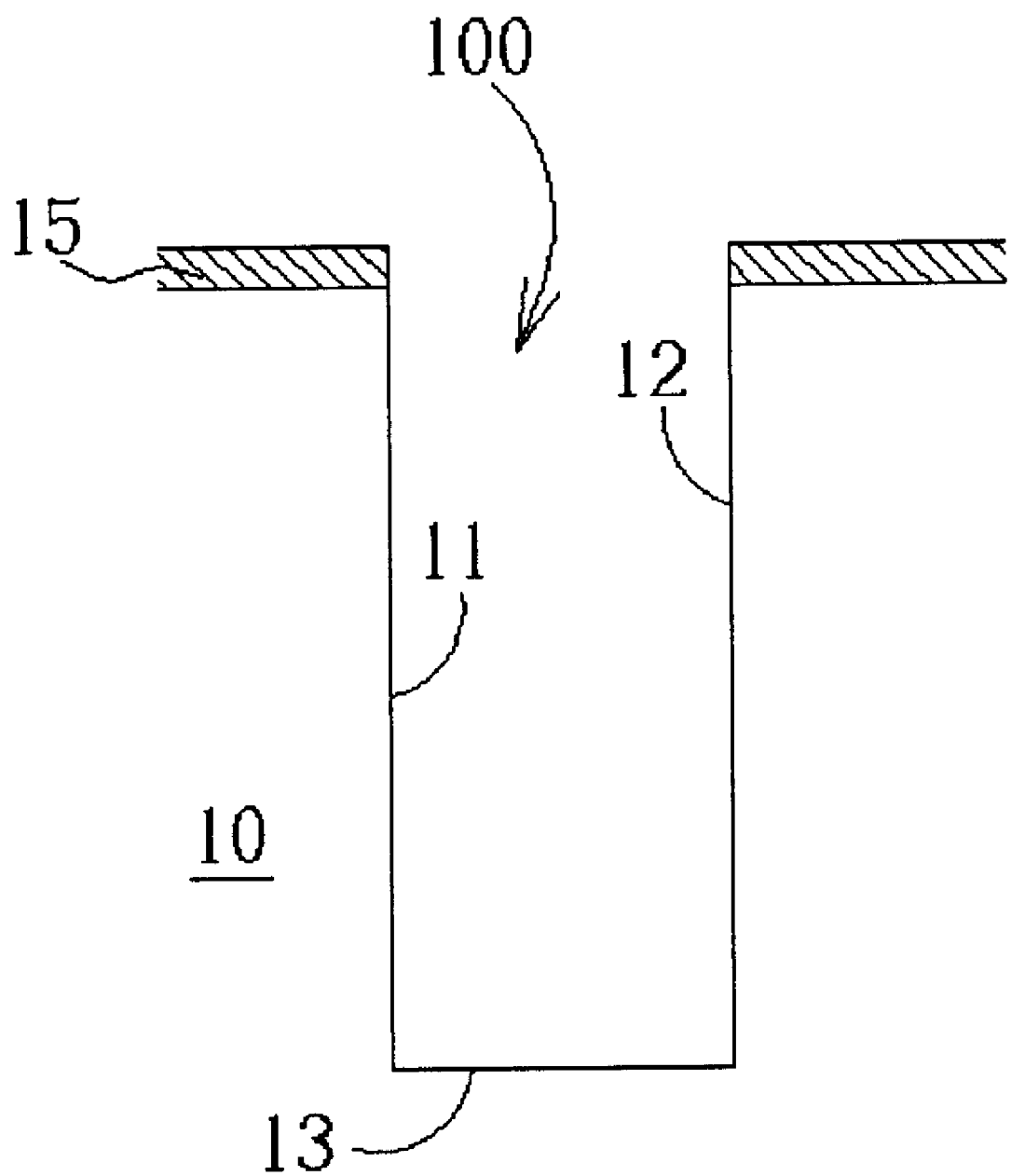
FIG. 2 to FIG. 5 are schematic cross-sectional diagrams illustrating the preferred embodiment of making the structure I according to the present invention.

Please refer to FIG. 2 to FIG. 5. FIG. 2 to FIG. 5 are schematic cross-sectional diagrams illustrating the preferred embodiment of making the structure I according to the present invention. As shown in FIG. 2, a recess or a trench 100 is provided in a semiconductor layer 10 such as a silicon substrate. The trench 100 has sidewall 11, sidewall 12, and bottom 13. The formation of the trench 100 may be completed using conventional STI processes. In the STI processes, a pad layer 15 serves as an etching mask and a conventional reactive ion etching (RIE) is performed.

Figure 3:
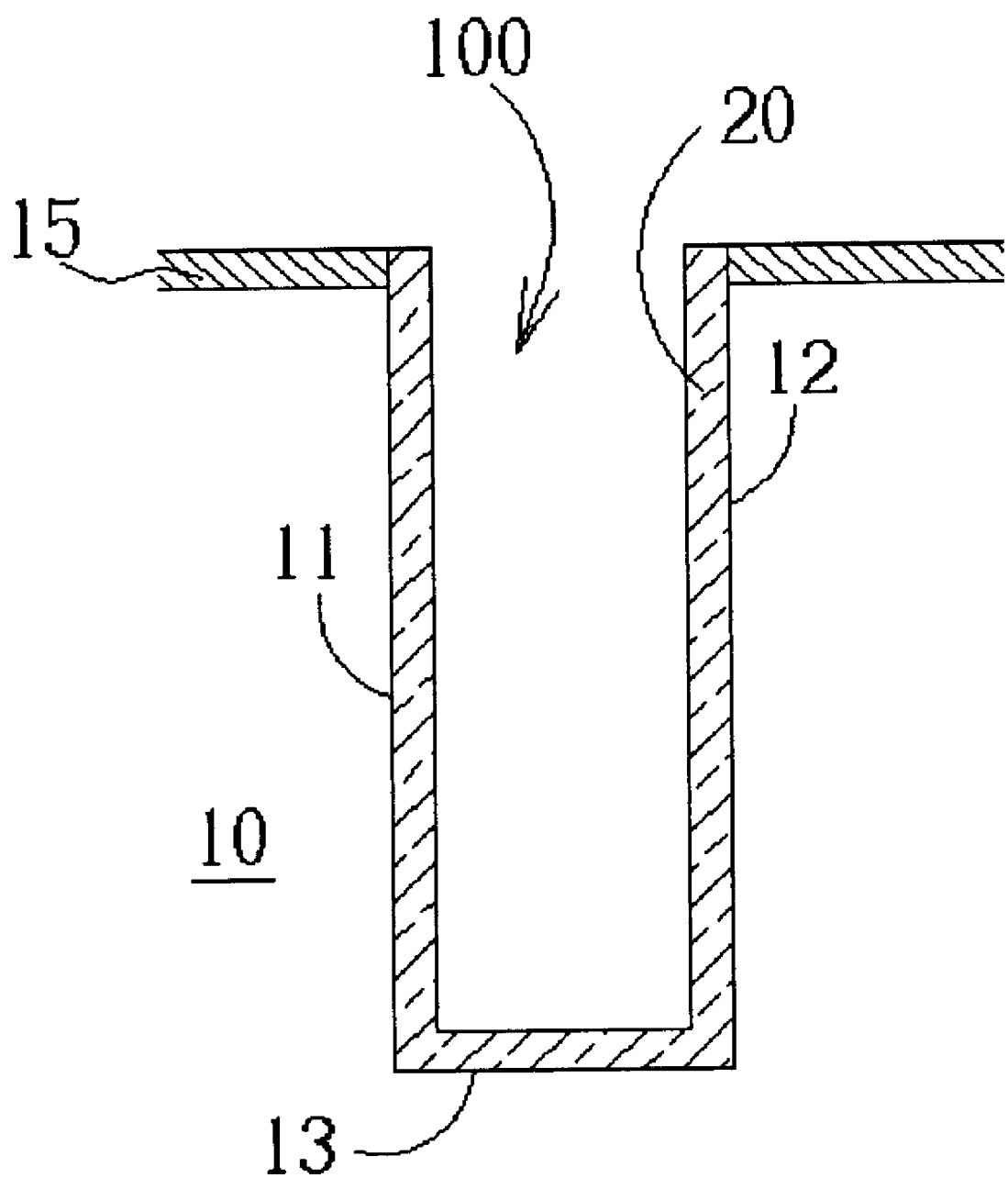

As shown in FIG. 3, an oxidation process is then carried out to thermally grow a silicon oxide layer 20 over the sidewall 11, the sidewall 12, and the bottom 13 of the trench 100.

Figure 4:
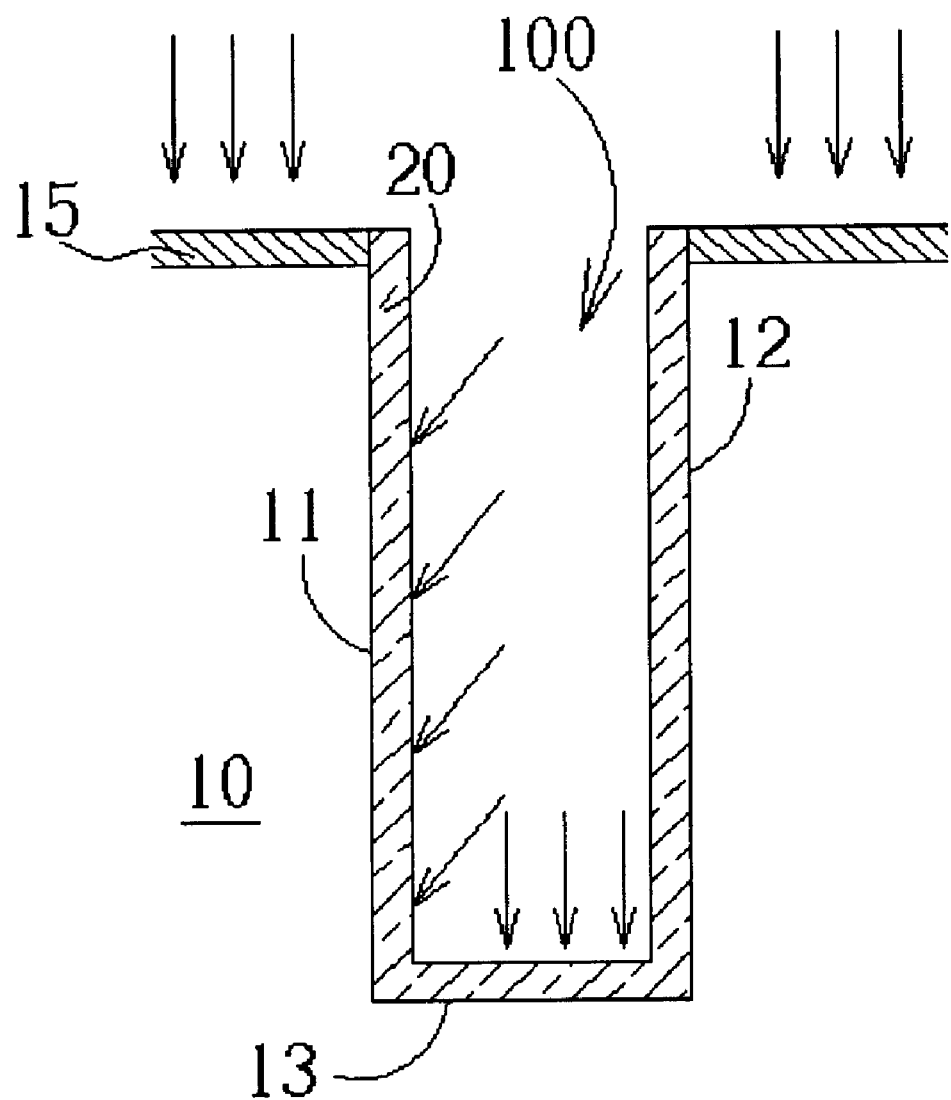
Figure 5:
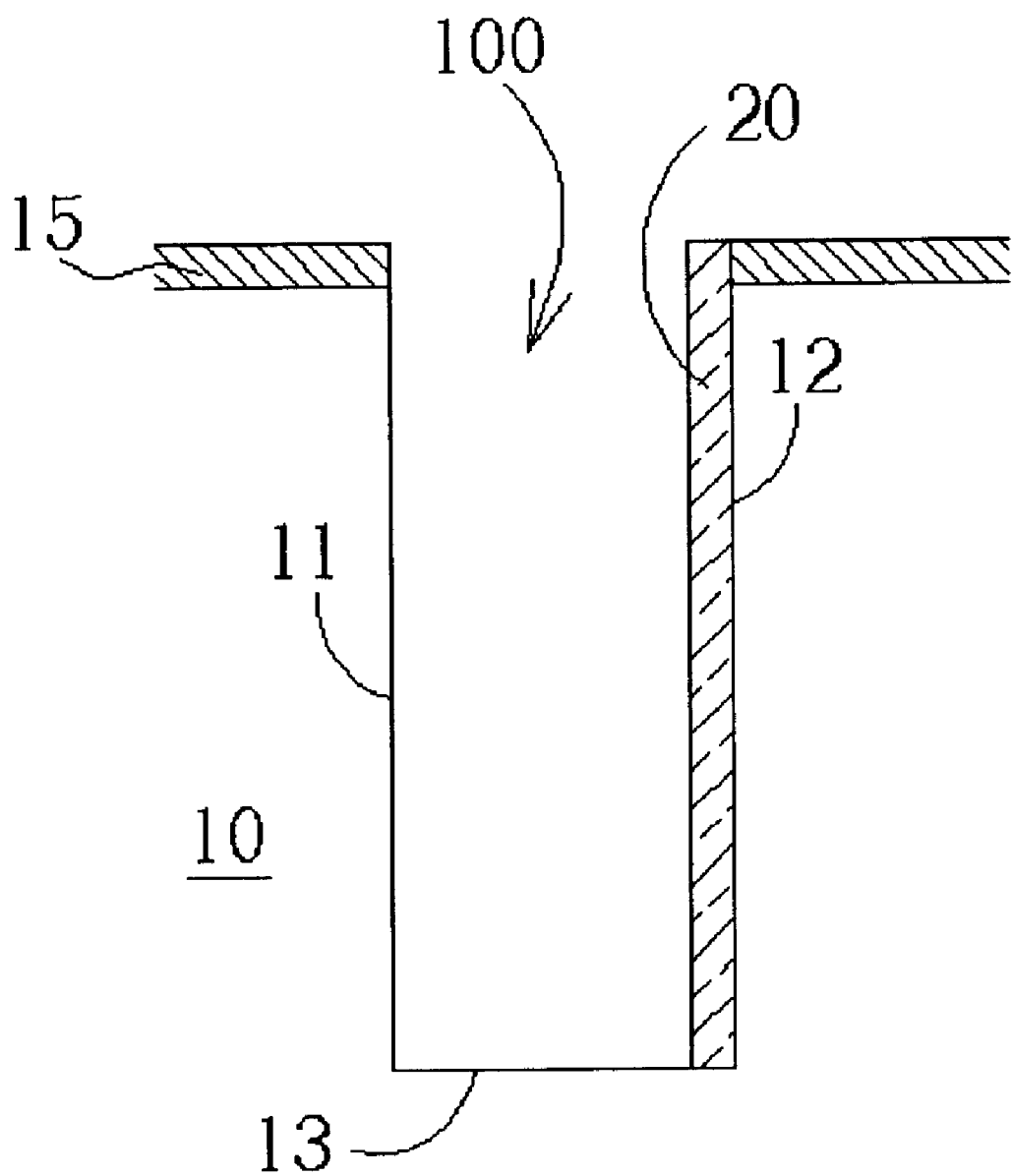

As shown in FIG. 4, a title angle ion implantation process is carried out to dope ions such as boron or phosphorus into the silicon dioxide layer 20 on the sidewall 11 and the bottom 13, but not on the silicon dioxide layer 20 on the sidewall 12. This doping step results in an etching selectivity between the doped silicon dioxide layer 20 on the sidewall 11 and the bottom 13 and the doped silicon dioxide layer 20 on the sidewall 12. As shown in FIG. 5, the doped silicon dioxide layer 20 on the sidewall 11 and the bottom 13 is etched away selective to the non-doped silicon dioxide layer 20 on the sidewall 12, thereby forming the structure I.

Structure II

Figure 6:
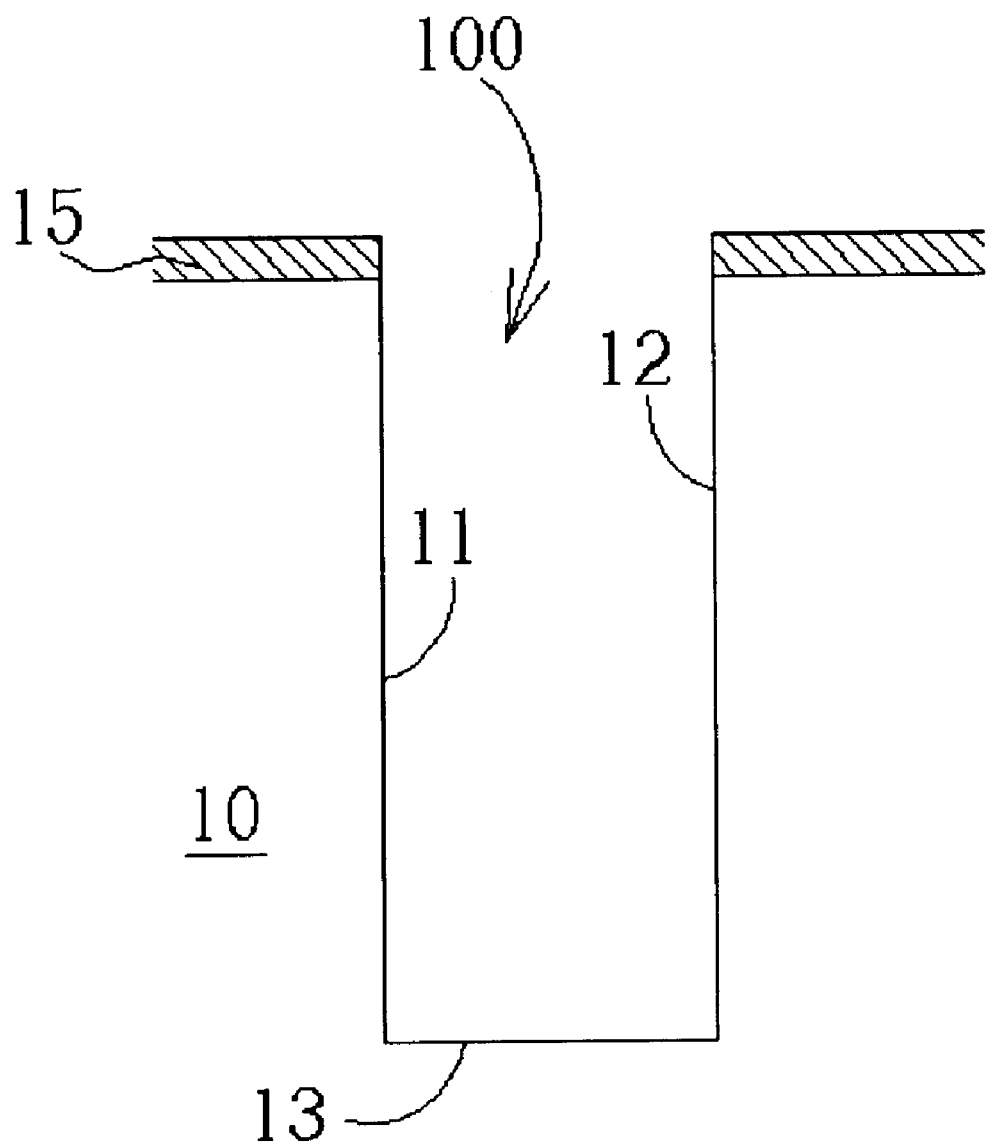
FIG. 6 to FIG. 12 are schematic cross-sectional diagrams illustrating the preferred embodiment of making the structure II according to the present invention.

Please refer to FIG. 6 to FIG. 12. FIG. 6 to FIG. 12 are schematic cross-sectional diagrams illustrating the preferred embodiment of making the structure II according to the present invention. As shown in FIG. 6, likewise, a recess or a trench 100 is provided in a semiconductor layer 10 such as a silicon substrate. The trench 100 has sidewall 11, sidewall 12, and bottom 13. The formation of the trench 100 may be completed using conventional STI processes. In the STI processes, a pad layer 15 serves as an etching mask and a conventional reactive ion etching (RIE) is performed.

Figure 7:
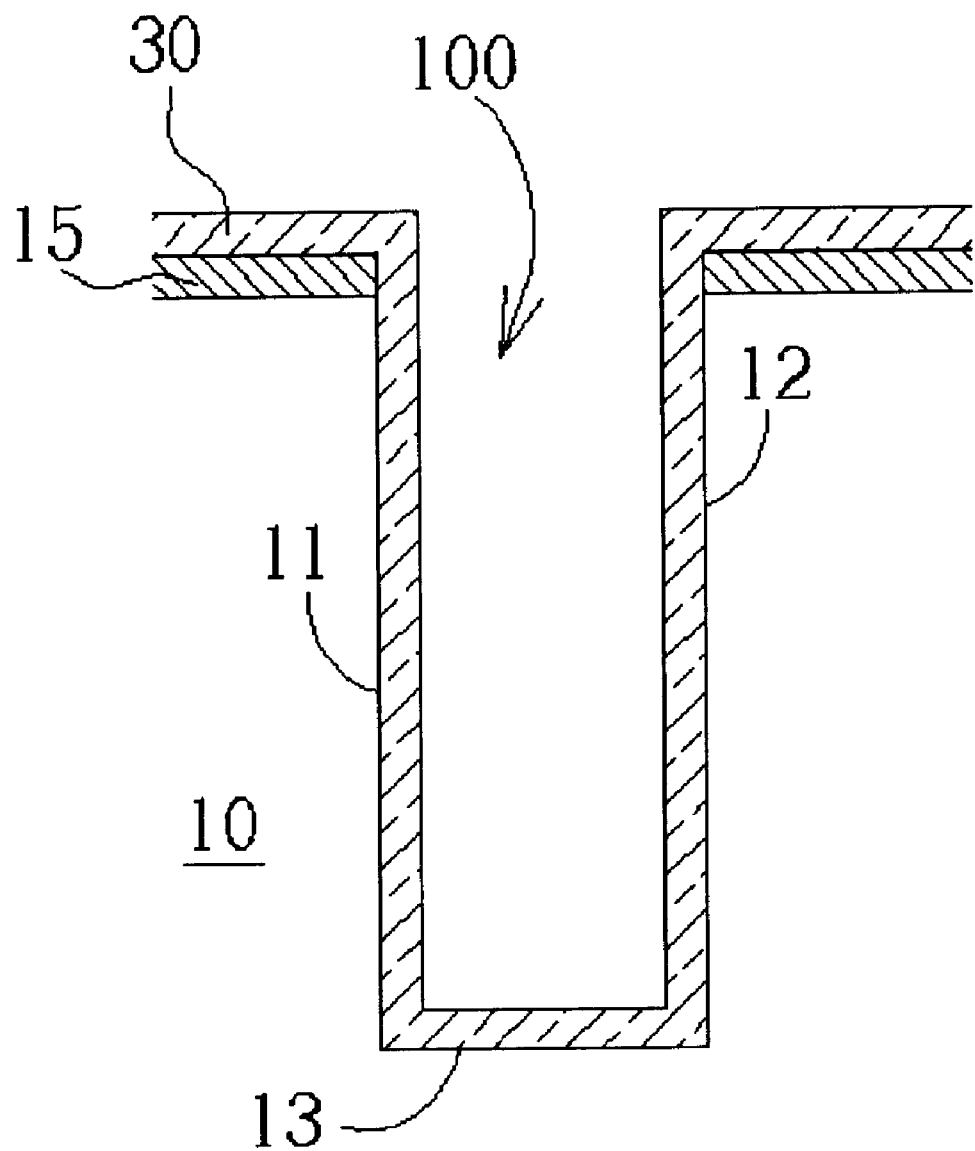

As shown in FIG. 7, a chemical vapor deposition (CVD) process is then carried out to deposit a silicon nitride layer 30 over the sidewall 11, the sidewall 12, and the bottom 13 of the trench 100.

Figure 8:
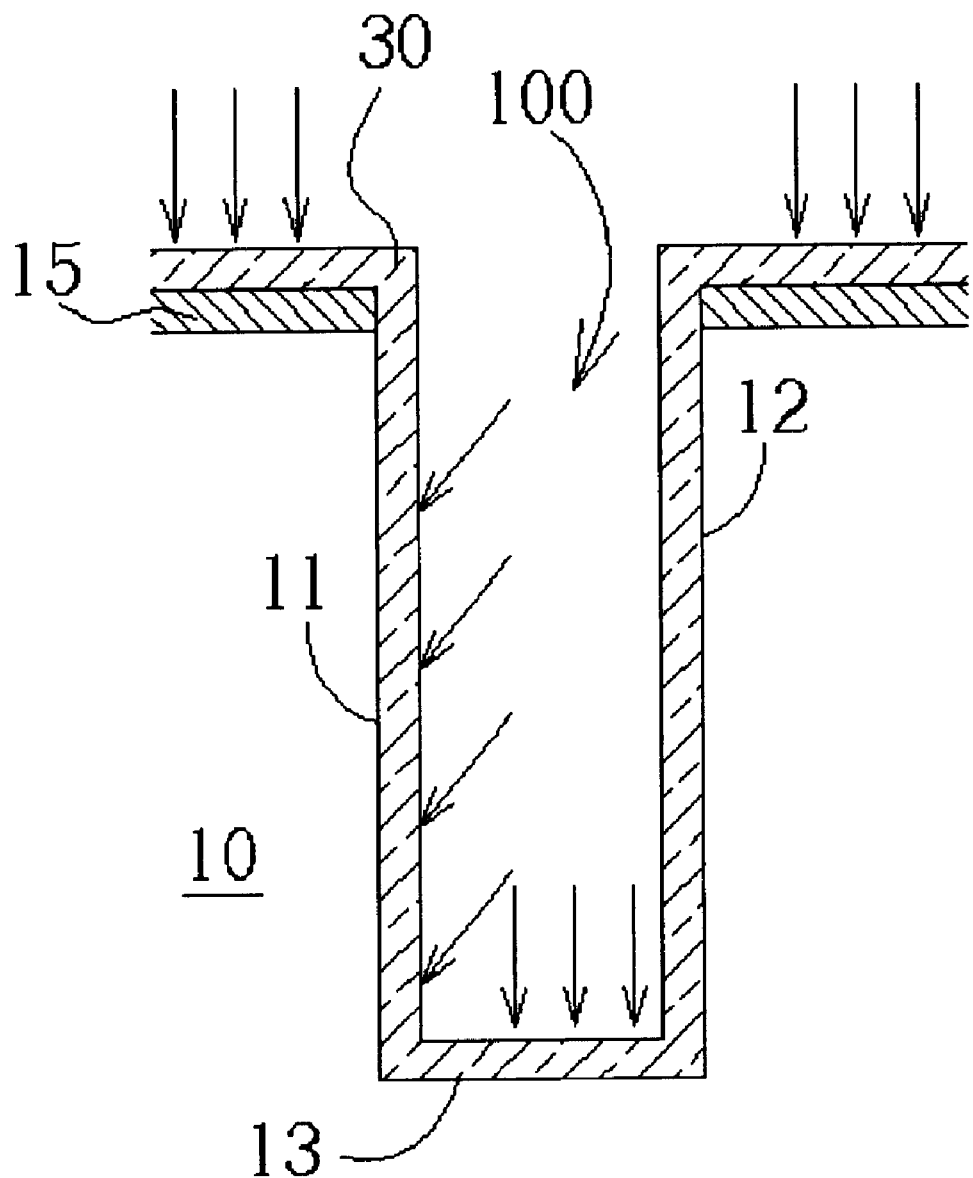
Figure 9:
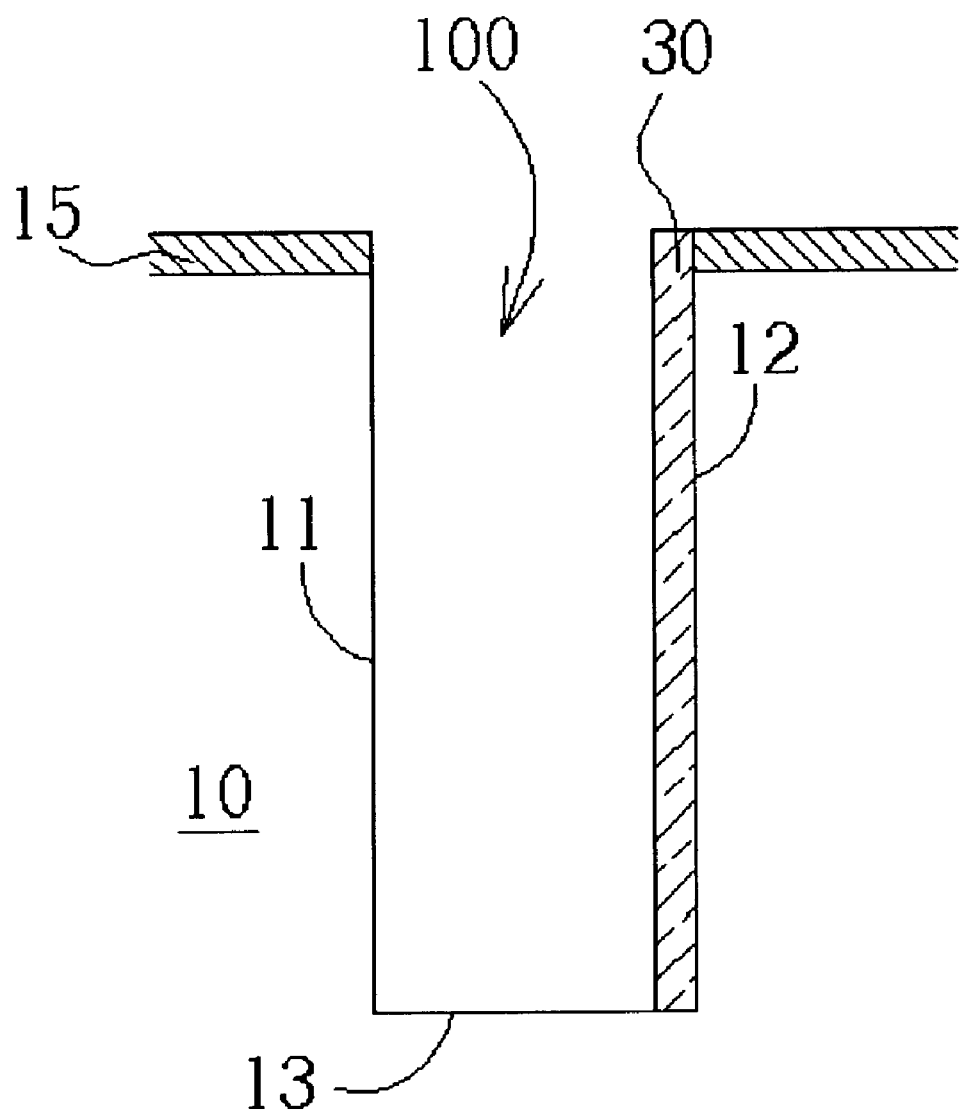

As shown in FIG. 8, a title angle ion implantation process is carried out to dope ions such as boron or phosphorus into the silicon nitride layer 30 on the sidewall 11 and the bottom 13, but not on the silicon nitride layer 30 on the sidewall 12. This doping step results in an etching selectivity between the doped silicon nitride layer 30 on the sidewall 11 and the bottom 13 and the doped silicon nitride layer 30 on the sidewall 12. As shown in FIG. 9, the doped silicon nitride layer 30 on the sidewall 11 and the bottom 13 is etched away selective to the non-doped silicon nitride layer 30 on the sidewall 12, thereby forming the structure II.

Structure III

Figure 10:
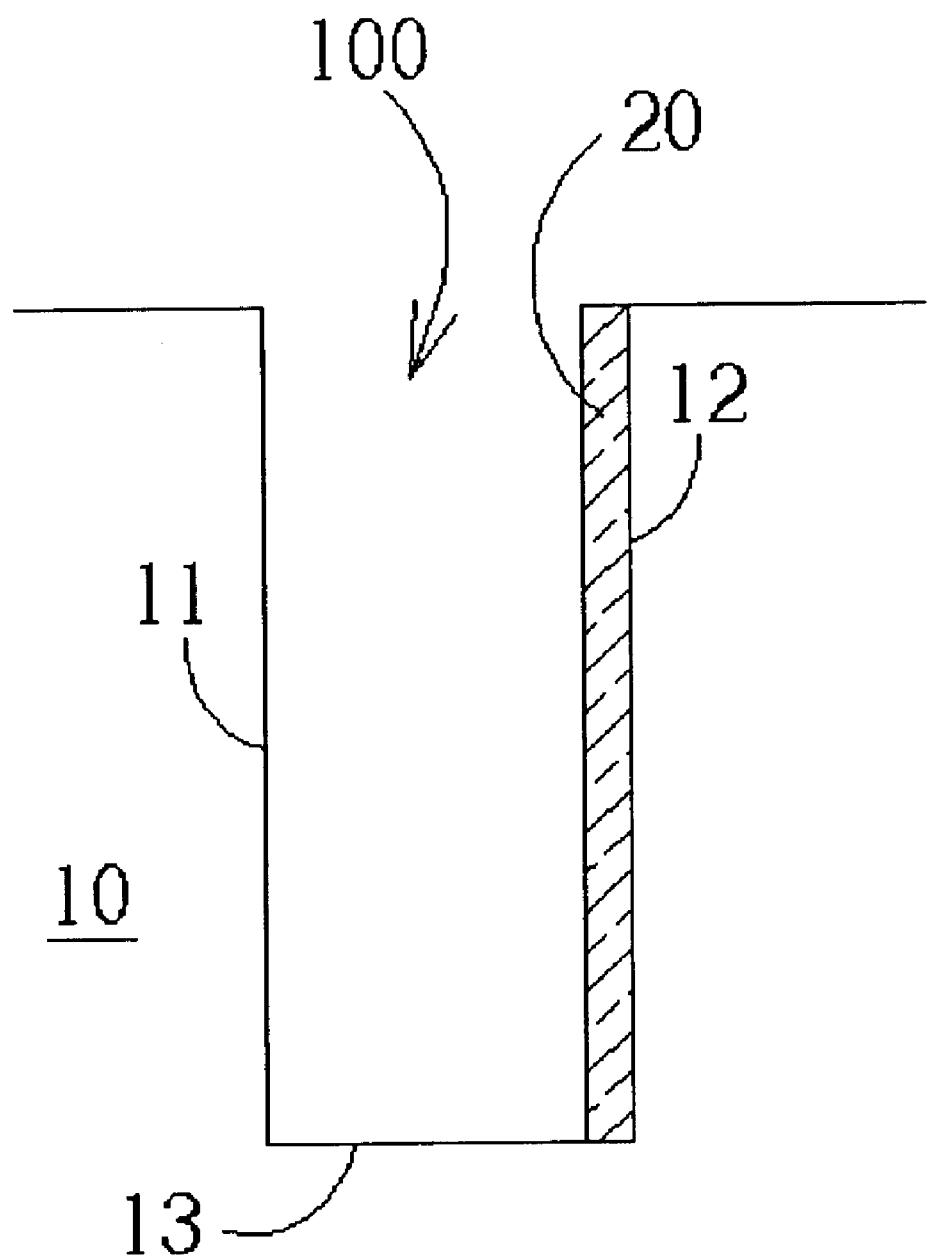
Figure 11:
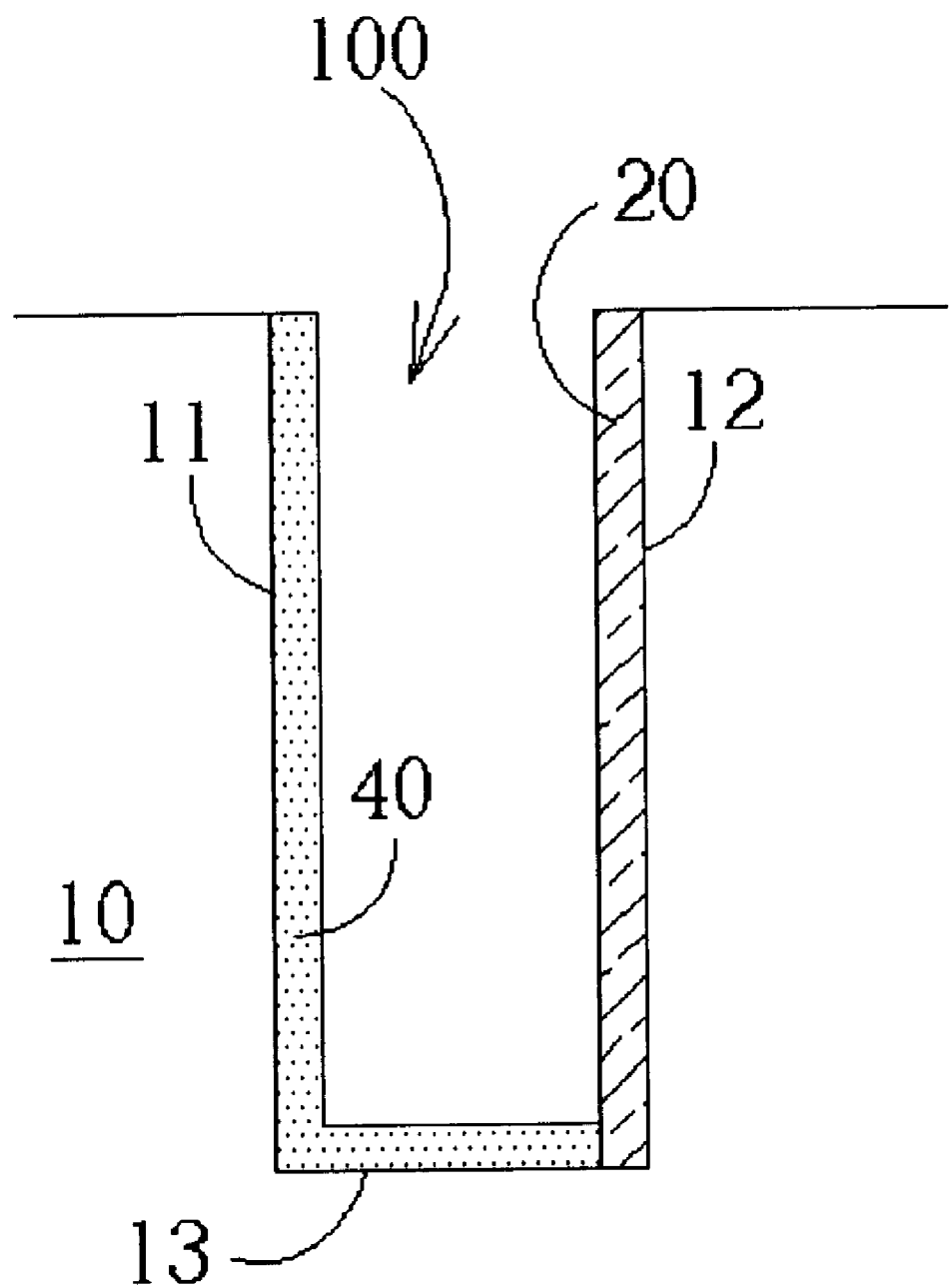
Figure 12:
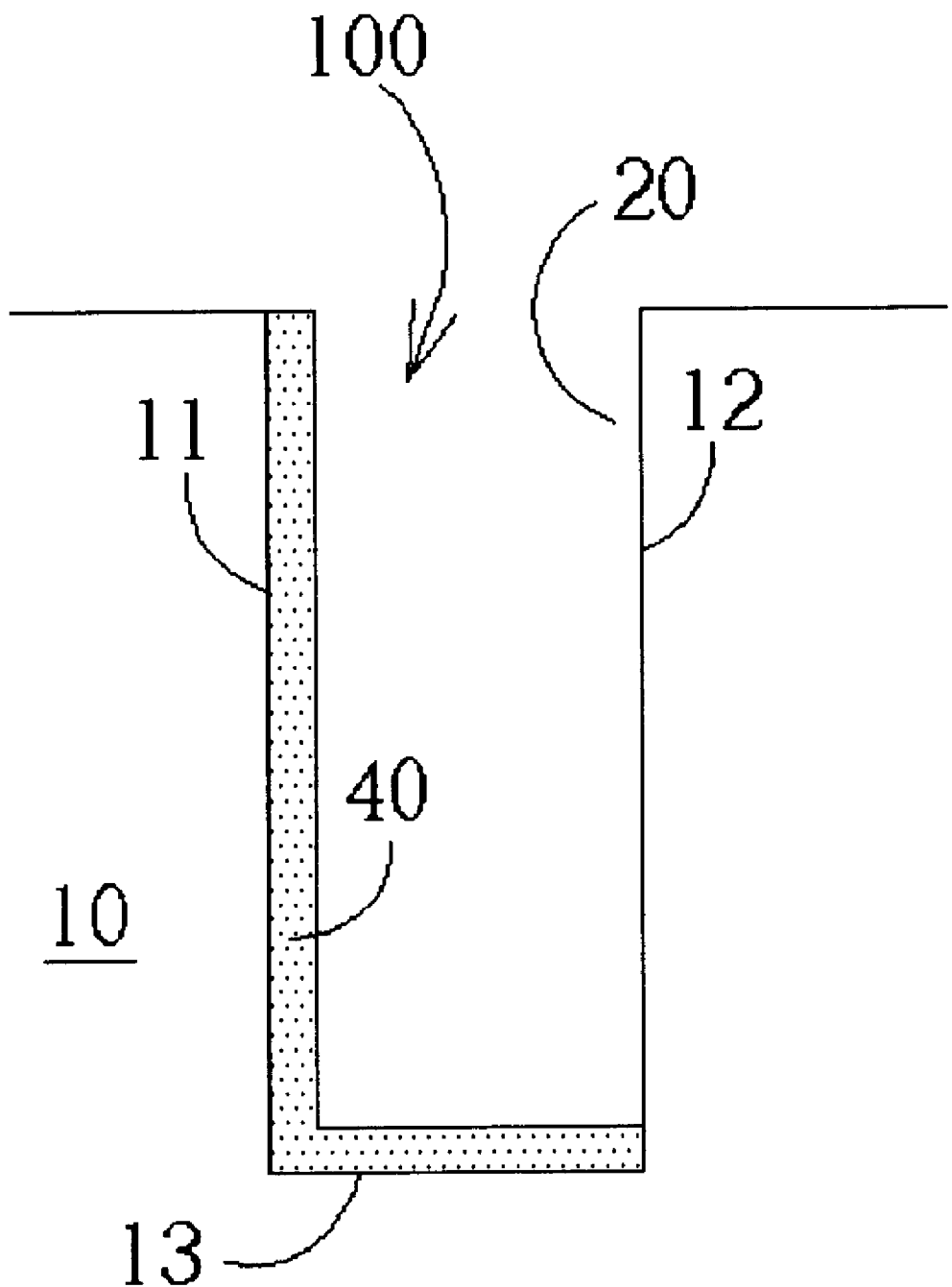

Please refer to FIG. 10 to FIG. 12. FIG. 10 to FIG. 12 are schematic cross-sectional diagrams illustrating the preferred embodiment of making the structure III according to the present invention, wherein the cross section as set forth in FIG. 10 is the structure I. The method for making the structure I has been illustrated through FIG. 2 to FIG. 5. As shown in FIG. 10, the method of making the structure III starts from the structure I. As mentioned, the structure I comprises a substrate 10 having a trench 100 thereon. A silicon dioxide layer 20 is formed on the sidewall 12. The sidewall 11 and the bottom 13 of the trench 100 are bare silicon surfaces.

As shown in FIG. 11, a rapid thermal nitridation (RTN) process is carried out to form an RTN silicon nitride layer 40 on the exposed sidewall 11 and the bottom 13.

As shown in FIG. 12, thereafter, the silicon dioxide layer 20 on the sidewall 12 is selectively etched away using methods known in the art such as diluted HF, leaving the silicon nitride layer 40 on the sidewall 11 and the bottom 13 intact.

Structure IV

Figure 13:
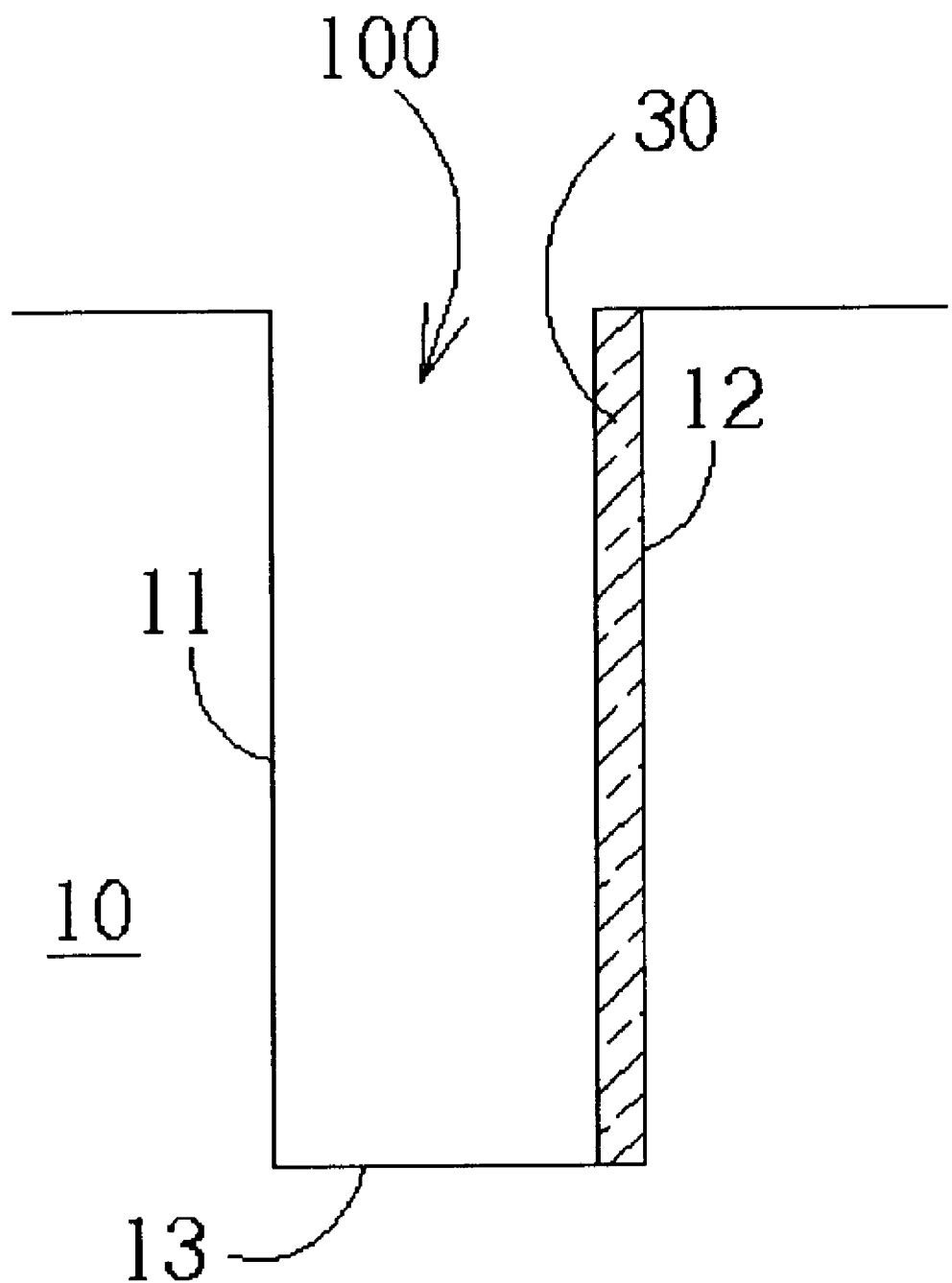
FIG. 13 to FIG. 15 are schematic cross-sectional diagrams illustrating the preferred embodiment of making the structure IV according to the present invention, wherein the cross section as set forth in FIG. 13 is the structure II.
Figure 14:
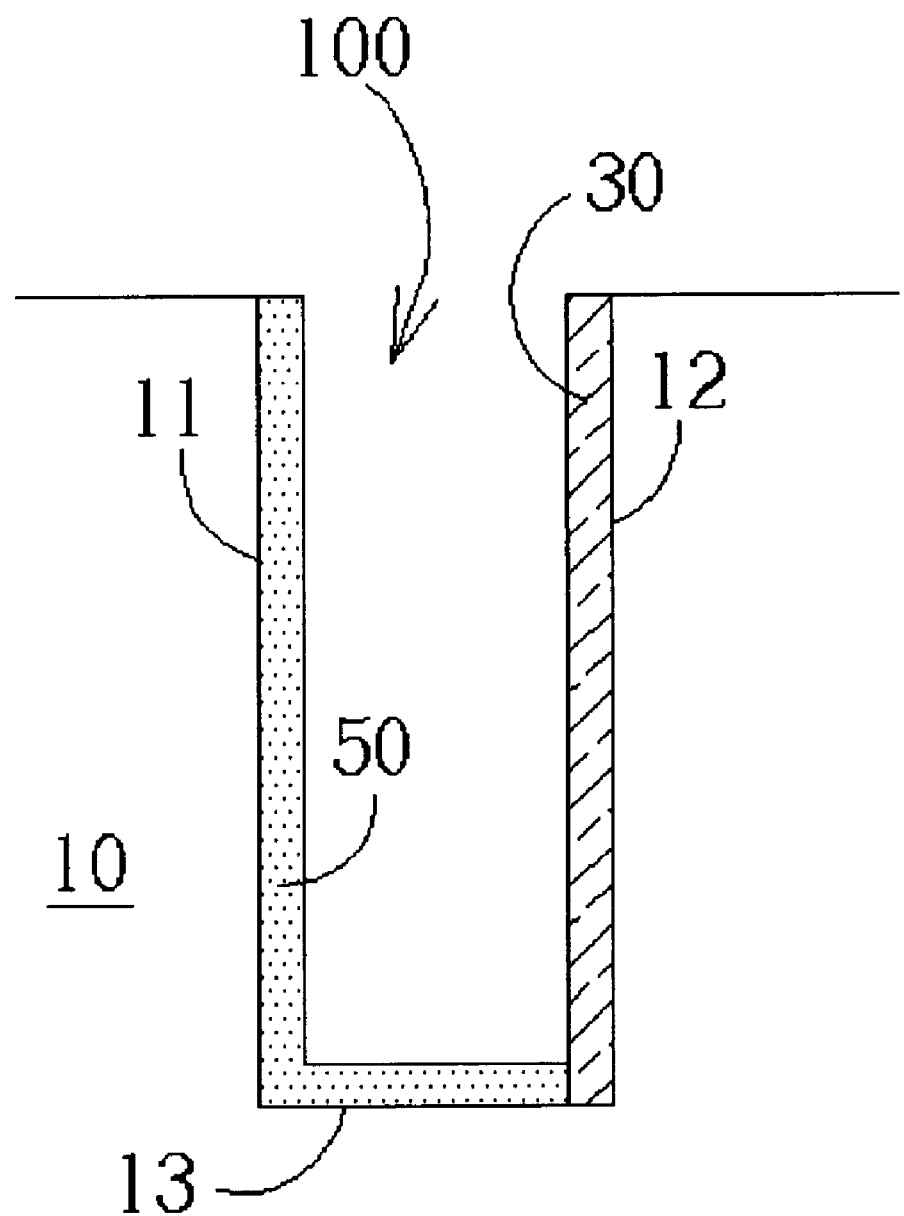
Figure 15:
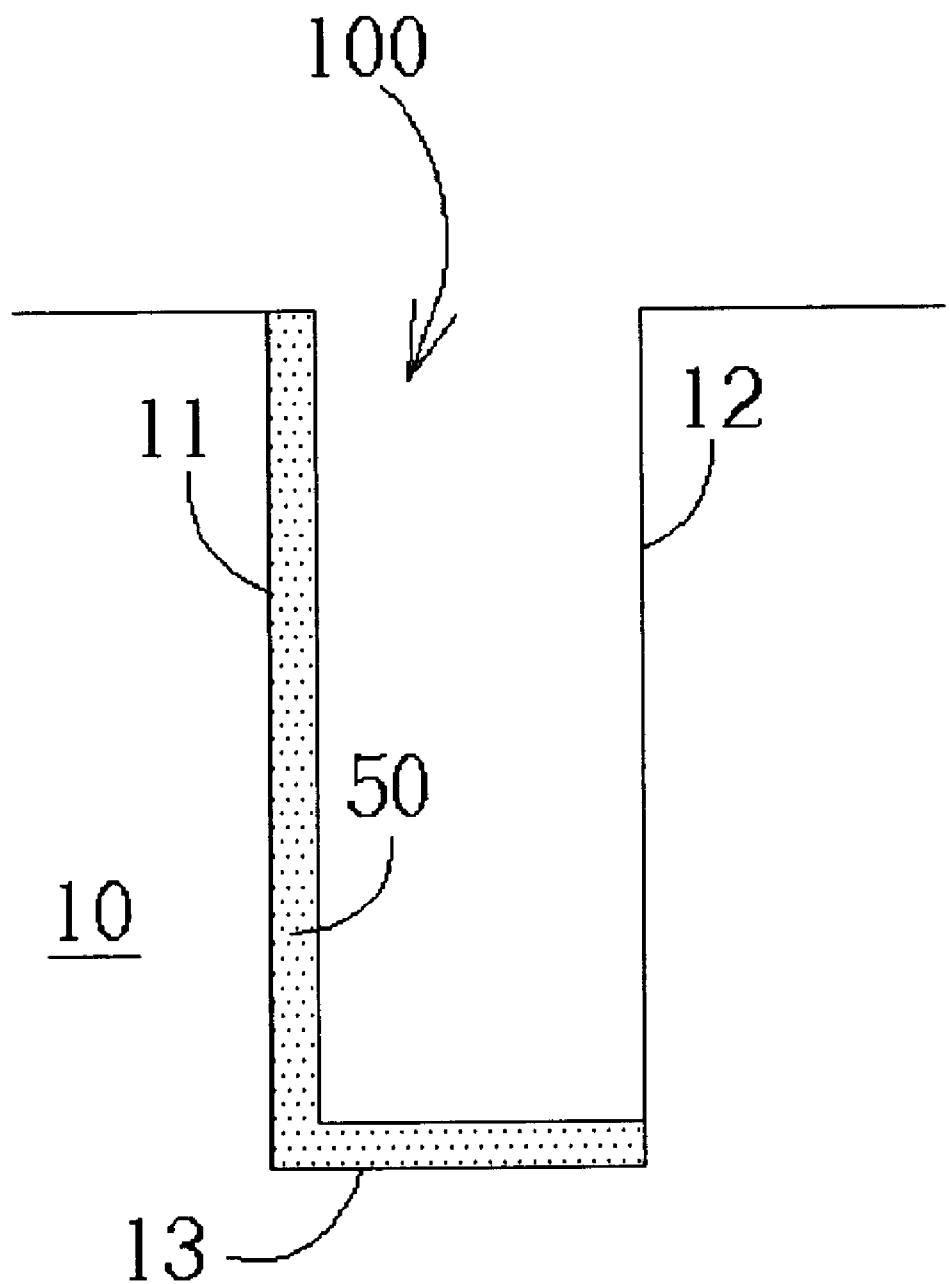

Please refer to FIG. 13 to FIG. 15. FIG. 13 to FIG. 15 are schematic cross-sectional diagrams illustrating the preferred embodiment of making the structure IV according to the present invention, wherein the cross section as set forth in FIG. 13 is the structure II. The method for making the structure II has been illustrated through FIG. 6 to FIG. 9. As shown in FIG. 13, the method of making the structure IV starts from the structure II. As mentioned, the structure II comprises a substrate 10 having a trench 100 thereon. The trench 100 comprises a sidewall 11, sidewall 12, and bottom 13. A silicon nitride layer 30 is formed on the sidewall 12. The sidewall 11 and the bottom 13 of the trench 100 are exposed bare silicon surfaces.

As shown in FIG. 14, a rapid thermal oxidation (RTO) process is carried out togrow an RTO silicon oxide layer 50 on the exposed bare silicon surfaces: sidewall 11 and bottom 13 of the trench 100.

As shown in FIG. 15, thereafter, the silicon nitride layer 30 on the sidewall 12 is selectively etched away using methods known in the art such as heated phosphoric acid, leaving the RTO silicon oxide layer 50 on the sidewall 11 and the bottom 13 intact.

Those skilled in the art will readily observe that numerous modifications and alterations of the present invention may be made while retaining the teachings of the invention. Accordingly, the above disclosure should be construed as limited only by the metes and bounds of the appended claims.

What is claimed is:

1. A method for making an asymmetric interior structure in a trench or contact hole of a substrate layer, comprising the steps of:

forming at least one trench or contact hole in a substrate layer, the trench or contact opening comprising a first sidewall, second sidewall, and a bottom;

forming a first dielectric layer on the first sidewall, the second sidewall, and the bottom;

performing a tilt angle ion implantation process to dope ions into the first dielectric layer on the first sidewall and on the bottom, but not dope ions into the first dielectric layer on the second sidewall, thereby resulting in etching selectivity between the doped first dielectric layer on the first sidewall and on the bottom, and the non-doped first dielectric layer on the second sidewall; and selectively etching away the doped first dielectric layer on the first sidewall and on the bottom, thereby forming an asymmetric interior structure in the trench or contact hole.

2. The method of claim 1 wherein the first dielectric layer is a silicon oxide layer.

3. The method of claim 1 wherein the first dielectric layer is a silicon nitride layer.

4. A method for making an asymmetric interior structure in a trench or contact hole of a substrate layer, comprising the steps of:

forming at least one trench or contact hole in a substrate layer, the trench or contact opening comprising a first sidewall, second sidewall, and a bottom forming a first dielectric layer on the first sidewall, the second sidewall, and the bottom;

performing a tilt angle ion implantation process to dope ions into the first dielectric layer on the first sidewall and on the bottom, but not dope ions into the first dielectric layer on the second sidewall, thereby resulting in etching selectivity between the doped first dielectric layer on the first sidewall and on the bottom, and the non-doped first dielectric layer on the second sidewall;

selectively etching away the doped first dielectric layer on the first sidewall and on the bottom;

growing a second dielectric layer on the exposed second sidewall and the bottom; and selectively etching away the first dielectric layer.

5. The method of claim 4 wherein the first dielectric layer is a silicon oxide layer, and the second dielectric layer is an RTN silicon nitride layer.

6. The method of claim 4 wherein the first dielectric layer is a silicon nitride layer, and the second dielectric layer is an RTO silicon oxide layer.

* * * * *